(12) United States Patent
Wang et al.

(10) Patent No.: US 10,446,618 B2
(45) Date of Patent: Oct. 15, 2019

(54) PIXEL STRUCTURE HAVING COMMON SUB-PIXELS AND OLED DISPLAY PANEL INCORPORATING THE PIXEL STRUCTURE

(71) Applicant: KUNSHAN GO-VISIONOX OPTO-ELECTRONICS CO., LTD., KunShan, Jiangsu (CN)

(72) Inventors: Xuliang Wang, KunShan (CN); Xiaozhao Zhu, KunShan (CN); Weili Li, KunShan (CN); Shuaiyan Gan, KunShan (CN); Xiujian Zhu, KunShan (CN)

(73) Assignee: KUNSHAN GO-VISIONOX OPTO-ELECTRONICS CO., LTD., Kunshan, Jiangsu (CN)

( * ) Notice: Subject to any disclaimer, the term of this patent is extended or adjusted under 35 U.S.C. 154(b) by 0 days.

(21) Appl. No.: 15/756,344

(22) PCT Filed: Sep. 1, 2016

(86) PCT No.: PCT/CN2016/097765
§ 371 (c)(1),
(2) Date: Feb. 28, 2018

(87) PCT Pub. No.: WO2017/045534
PCT Pub. Date: Mar. 23, 2017

(65) Prior Publication Data
US 2018/0247984 A1    Aug. 30, 2018

(30) Foreign Application Priority Data

Aug. 31, 2015 (CN) .......................... 2015 1 0551407

(51) Int. Cl.
*H01L 27/32* (2006.01)
*H01L 27/12* (2006.01)
(Continued)

(52) U.S. Cl.
CPC .......... *H01L 27/3218* (2013.01); *H01L 27/12* (2013.01); *H01L 27/3216* (2013.01); *G09G 3/2003* (2013.01); *G09G 3/3208* (2013.01)

(58) Field of Classification Search
None
See application file for complete search history.

(56) References Cited

U.S. PATENT DOCUMENTS

2013/0234917 A1    9/2013  Lee
2015/0152391 A1    6/2015  Bell
(Continued)

FOREIGN PATENT DOCUMENTS

CN    104009066 A    8/2014
CN    104037202 A    9/2014
(Continued)

*Primary Examiner* — Daniel Whalen
(74) *Attorney, Agent, or Firm* — Muncy, Geissler, Olds & Lowe, P.C.

(57) ABSTRACT

A pixel structure and an organic light-emitting diode (OLED) display panel incorporating the pixel structure are disclosed. The pixel structure includes a plurality of pixel units (110) arranged in an array, each pixel unit comprising a first sub-pixel (111), a second sub-pixel (112) and a third sub-pixel (113). The second sub-pixel (112) and the third sub-pixel (113) are common to four adjacent pixel units (110). As a result, a higher aperture ratio of the sub-pixels, an increased design margin and reduced process difficulty can be obtained.

6 Claims, 4 Drawing Sheets

(51) Int. Cl.
G09G 3/20 (2006.01)
G09G 3/3208 (2016.01)

(56) References Cited

U.S. PATENT DOCUMENTS

2015/0364525 A1   12/2015  Lin et al.
2016/0240594 A1*   8/2016  Zhu .................... H01L 27/3218
2016/0343284 A1*  11/2016  Sun .................... H01L 51/0011

FOREIGN PATENT DOCUMENTS

| | | | |
|---|---|---|---|
| CN | 204257654 U | | 4/2015 |
| CN | 104597655 A | | 5/2015 |
| CN | 104616597 A | | 5/2015 |
| CN | 204332961 U | * | 5/2015 |
| CN | 204885166 U | | 12/2015 |
| CN | 204885167 U | | 12/2015 |
| EP | 2637209 A1 | | 9/2013 |
| KR | 20150056112 A | | 5/2015 |
| TW | 201419525 A | | 5/2014 |

\* cited by examiner

US 10,446,618 B2

PIXEL STRUCTURE HAVING COMMON SUB-PIXELS AND OLED DISPLAY PANEL INCORPORATING THE PIXEL STRUCTURE

TECHNICAL FIELD

The present invention relates to the field of display technology and, in particular, to a pixel structure and an organic light-emitting diode (OLED) display panel incorporating the pixel structure.

BACKGROUND

Organic light-emitting diode (OLED) display panels are considered to be the most potential next generation of new flat panel display technology thanks to their wide variety of outstanding advantages including active illumination, slimness, a large viewing angle, fast response, good energy-saving performance, a wide temperature tolerance range and capabilities of flexible and transparent display.

There have been well developed insofar two full-color techniques for OLED display panels: color filters (CF) and RGB (the three primary colors: red, green and blue) pixels.

Like those used in liquid crystal display (LCD) panels, color filters can also be used in OLED display panels for the full-color effect. In these cases, white-light OLEDs serve as backlight playing the same role as both backlight and liquid crystal molecules in LCD panels, and color filters are placed thereon to form red, green and blue sub-pixels. In this way, the resolution and large panel requirements can be satisfied. However, as light loses significant energy when passing through the color filters, such display panels suffer from significant power consumption.

In order to address the high power consumption issue, full-color OLED display panels using RGB pixels have been developed.

FIG. 1 schematically illustrates an existing OLED display panel utilizing RGB pixels. As shown in FIG. 1, the OLED display panel is formed in a paralleled RGB manner and has multiple pixel units Pixel each including, horizontally aligned, one red sub-pixel unit R, one green sub-pixel unit G and one blue sub-pixel unit B. The sub-pixel units in the OLED display panel are arranged in a matrix and each of them has a display section 1 and a non-display section 2. Specifically, the display section 1 of each sub-pixel unit is provided with a cathode, an anode and an electroluminescent layer (organic emission layers) disposed therebetween to generate light of the prescribed color so as to enable the display of an image. The electroluminescent layer is usually fabricated by vapor deposition. During the fabrication of the conventional display panel, three vapor deposition processes are carried out to form electroluminescent layers for the corresponding colors (red, green and blue) in the display sections 1 of the pixel units.

FIG. 2 schematically illustrates another existing OLED display panel utilizing RGB pixels. As shown in FIG. 2, the OLED display panel formed in an RGB matrix manner has multiple pixel units Pixel each including one red sub-pixel unit R, one green sub-pixel unit G and one blue sub-pixel unit B. Two out of these three sub-pixel units, for example, the red sub-pixel unit R and the green sub-pixel unit G are arranged in a column, and the third sub-pixel unit, for example, the blue sub-pixel unit B, is disposed in another column. As such, the sub-pixel units in the OLED display panel are arranged in a matrix.

As technology evolves, users are increasingly demanding for OLED display panels with higher resolution, and the conventional RGB pixel arrangements have fallen short in meeting the increasingly higher PPI (pixels per inch) requirements.

SUMMARY OF THE INVENTION

The present invention provides a pixel structure, comprising a plurality of pixel units arranged in an array, each pixel unit comprising a first sub-pixel, a second sub-pixel and a third sub-pixel, the second and third sub-pixels being common to four adjacent ones of the pixel units.

In one embodiment, adjacent four third sub-pixels may be arranged to define a quadrilateral encompassing one second sub-pixel and adjacent four first sub-pixels so that four pixel units are formed in which each of the four first sub-pixels is located between the second sub-pixel and a corresponding one of the four third sub-pixels.

In one embodiment, each first sub-pixel may reside on a line segment connecting centers of its adjacent second and third sub-pixels.

In one embodiment, the first, second and third sub-pixels may all be polygons.

In one embodiment, the first, second and third sub-pixels may be quadrilaterals, hexagons, octagons or any combination thereof.

In one embodiment, the first sub-pixel may be a rectangle, with each of the second and third sub-pixels being a square.

In one embodiment, short sides of each first sub-pixel may be parallel to a line segment connecting centers of its adjacent second and third sub-pixels. Alternatively, the short sides of each first sub-pixel may be perpendicular to a line segment connecting centers of its adjacent second and third sub-pixels.

In one embodiment, the first, second and third sub-pixels in one pixel unit may be symmetric to corresponding ones in an adjacent unit.

In one embodiment, the first sub-pixel may have an area smaller than an area of the second and third sub-pixels.

The present invention also provides an organic light-emitting diode (OLED) display panel comprising a pixel structure as defined above.

In order to solve the problem described above, the present invention provides a pixel structure for use in an OLED display panel, in which each pixel unit includes a first sub-pixel, a second sub-pixel and a third sub-pixel, and the second and third sub-pixels are common to four adjacent pixel units. As a result, a higher aperture ratio of the sub-pixels can be obtained at the same PPI and design margin. Alternatively, an increased design margin and reduced process difficulty can be obtained at the same PPI and aperture ratio.

DETAILED DESCRIPTION

As described in the Background section, the conventional RGB pixel arrangements have fallen short in meeting the increasingly higher PPI requirements. In view of this, it is proposed in the present invention a pixel structure for an organic light-emitting diode (OLED) display panel, comprising a plurality of pixel units arranged in an array, each including a first sub-pixel, a second sub-pixel and a third sub-pixel. The second and third sub-pixels are common to four adjacent pixel units. This arrangement allows a higher aperture ratio of the sub-pixels and a longer life span of the display device at the same PPI and design margin, or an increased design margin, reduced process difficulty and an improved yield at the same PPI and aperture ratio.

Presented above is the basis concept of the present application. The subject matter of specific embodiments of the present invention will be fully described with reference to the drawings accompanying the embodiments so that it will be more apparent. Obviously, the disclosed embodiments are only some rather than all embodiments of the invention. All other embodiments made by those of ordinary skill in the art based on the embodiments disclosed herein without inventive efforts fall within the scope of the present invention.

Although numerous specific details are set forth below to facilitate a thorough understanding of the present invention, the invention can also be implemented in other ways than those described herein and those skilled in the art can make similar forms thereof without departing from the spirit of the present invention. Therefore, the present invention is not limited to the specific embodiments disclosed below.

The present invention will be described in detail with reference to the accompanying drawings. In order to facilitate the following detailed description, the structural sectional views may not be drawn to scale with parts showing some elements being enlarged. These schematics are provided merely for example and shall not be deemed as limiting the scope of the invention. Further, in practical fabrication, three-dimensional dimensions of the components, i.e., their lengths, widths and depths shall also be taken into account.

The pixel structure and the OLED display panel incorporating the pixel structure will be described in details with reference to the embodiments described below. For the sake of clarity and brevity, the positions of the sub-pixels are described with respect to their centers. However, the present invention is not limited to this, and it is to be understood by those skilled in the art that the positions of the sub-pixels may also be described with respect to their apexes or other references.

Embodiment 1

Figure 1:
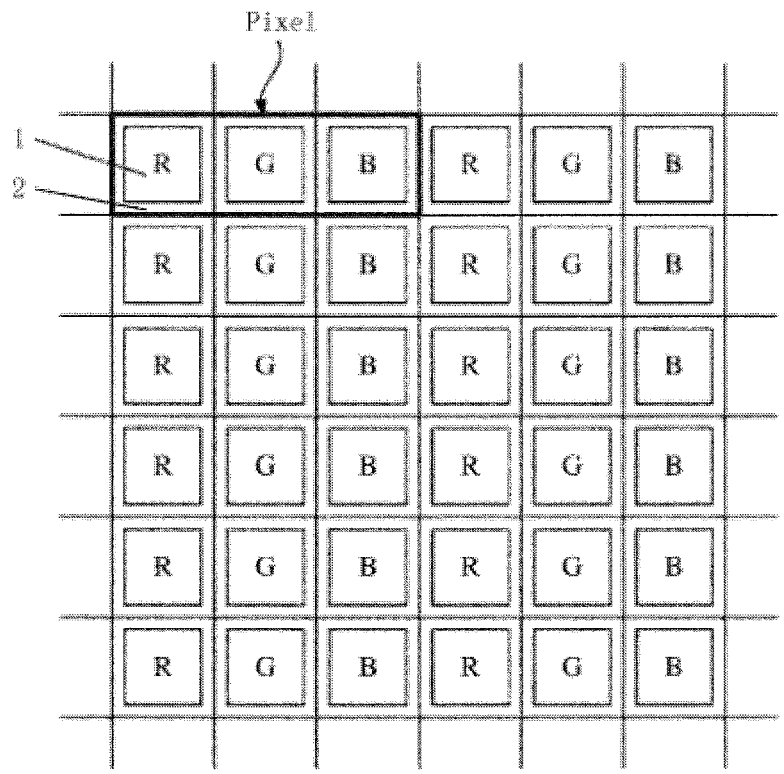
FIG. 1 schematically illustrates part of a pixel structure in an existing organic light-emitting diode (OLED) display panel.
Figure 2:
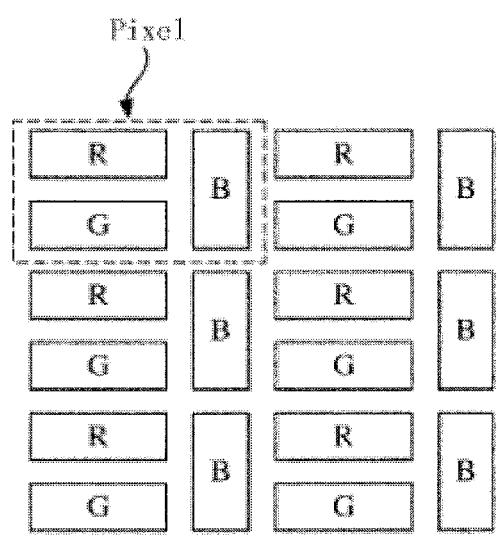
FIG. 2 schematically illustrates part of a pixel structure in another existing OLED display panel.
Figure 3:
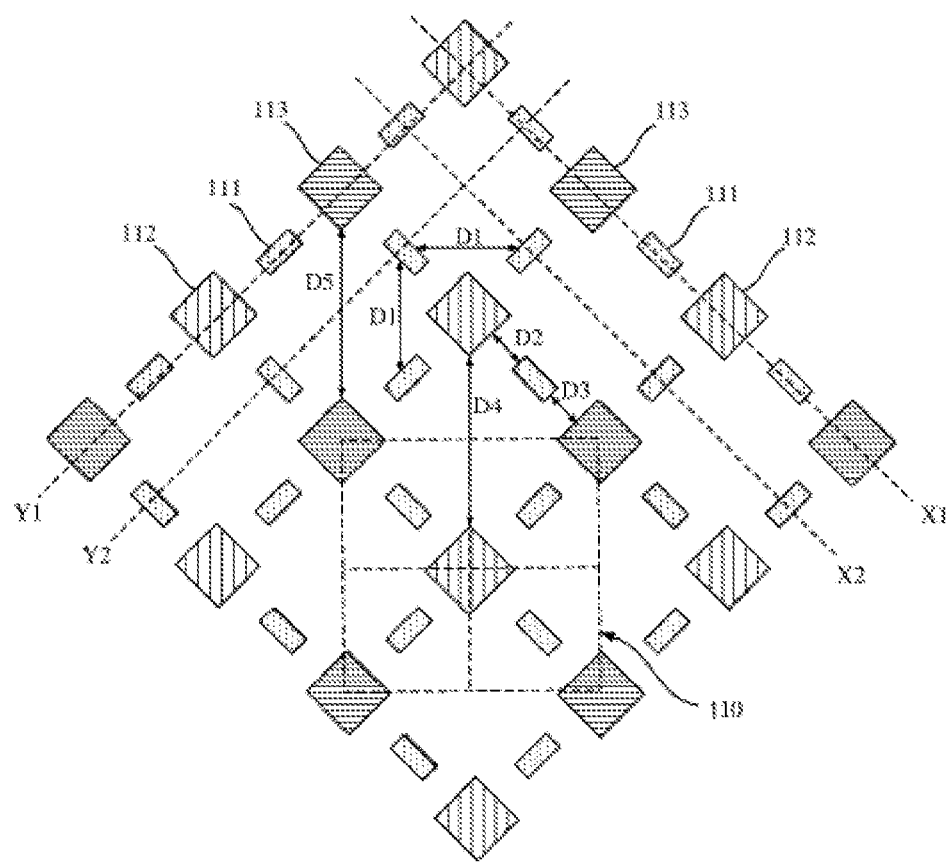
FIG. 3 is a schematic showing part of a pixel structure in an OLED display panel according to a first embodiment of the present invention.
Figure 4:
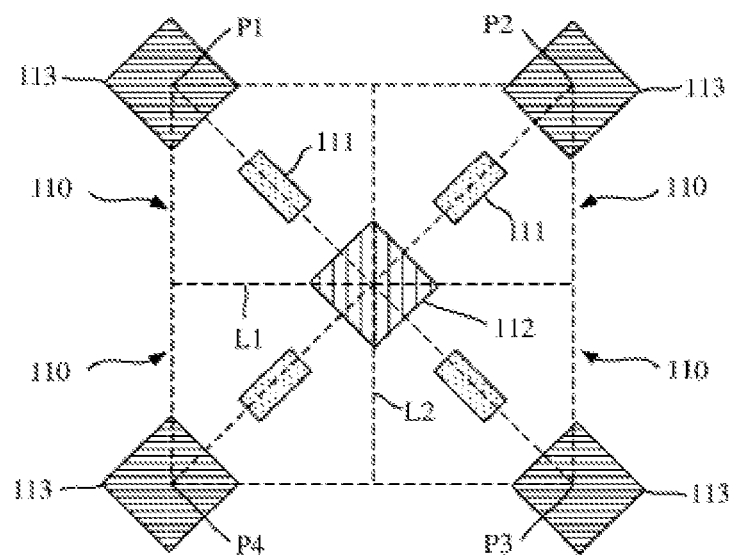
FIG. 4 is a schematic illustration of four pixel units in the pixel structure of FIG. 3.

FIG. 3 is a schematic showing part of a pixel structure in an OLED display panel according to a first embodiment of the present invention. FIG. 4 is a schematic illustration of four pixel units in the pixel structure of FIG. 3.

As shown in FIGS. 3 to 4, the pixel structure of the OLED display panel includes a plurality of pixel units 110 arranged in an array, each comprising three sub-pixels including a first sub-pixel 111, a second sub-pixel 112 and a third sub-pixel 113. The first sub-pixel 111 is dedicated to the specific pixel unit 110, while the second and third sub-pixels 112, 113 are common to four adjacent pixel units. This arrangement enables, on the one hand, an increased aperture ratio of the sub-pixels and hence a longer life span of the display device at the same PPI and design margin, and on the other hand, an increased design margin and reduced process difficulty at the same PPI and aperture ratio because of expanded pixel-to-pixel spacings which are favorable to the reliability of organic emission layer deposition processes utilizing fine metal masks.

As indicated by the dashed square boxes in FIG. 4, every four adjacent third sub-pixels 113 are arranged to define a quadrilateral, for example, a square, encompassing one second sub-pixel 112 and four adjacent first sub-pixels 111. That is to say, every four adjacent third sub-pixels 113 surround a second sub-pixel 112 and four sub-pixels 111. Specifically, the four third sub-pixels 113 are respectively located at the four vertices P1, P2, P3, P4 of the quadrilateral and the four first sub-pixels 111 are interposed between the third sub-pixels 113 and the second sub-pixel 112 so that four pixel units 110 are defined, as shown in FIG. 4, with the second sub-pixel 112 being common to them.

With emphasized reference to FIG. 4, in this embodiment, the second sub-pixel 112 resides right at a center of the quadrilateral, with the first sub-pixels 111 being situated on respective line segments connecting centers of the second sub-pixel 112 and the respective third sub-pixels 113. Further, the first sub-pixels 111 may reside on the respective midpoints of the line segments connecting the second sub-pixel 112 and the third sub-pixels 113. It is a matter of course that the positions of the first sub-pixels 111 is not limited to those as described above, and they may be, for example, not located on the midpoints of the line segments connecting the second sub-pixel 112 and the third sub-pixels 113. In fact, the first sub-pixels 111 may be arranged at any positions between the second sub-pixel 112 and the third sub-pixels 113 as long as their positions ensure the second and third sub-pixels 112, 113 are common to the four adjacent pixel units.

In this embodiment, the first, second and third sub-pixels 111, 112, 113 in the pixel structure each assume a quadrilateral shape. In particular, the first sub-pixels 111 are rectangles, and the second and third sub-pixels 112, 113 are squares. Further, the long sides of each of the first sub-pixel 111 are oriented parallel to the line segment connecting centers of the second sub-pixel 112 and a corresponding one of the third sub-pixels 113, and its short sides extend perpendicular to this line segment.

Furthermore, the first sub-pixels 111 in every two adjacent pixel units are in mirror symmetry with respect to a line segment connecting the two second sub-pixels 112 both nearest to both of the specific first sub-pixels, for example, the imaginary side L1 or L2. Here, the phase "mirror symmetry" means that the two first sub-pixels 111 are of the same shape but oriented in different directions. Additionally, every two adjacent second sub-pixels 112, as well as every two adjacent third sub-pixels 113, are in exact symmetry to each other. Here, the phase "exact symmetry" means that means that the two sub-pixels are identical to each other in terms of shape and orientation.

While the first, second and third sub-pixels 111, 112, 113 have been described above as each having a quadrilateral shape as an example, it is to be noted that in other embodiments of the present invention, they may also have one or more of many other polygonal shapes such as triangular, pentagonal, hexagonal, heptagonal and octagonal, and the long sides of the first sub-pixel 111 may also not be parallel to the line segment connecting the centers of the corresponding second and third sub-pixels 112, 113 and may, for example, form a certain angle therewith.

With reference to FIGS. 3 and 4, in this embodiment, the second and third sub-pixels 112, 113 have the same area, and each first sub-pixel 111 has an area smaller than the area of the second and third sub-pixels 112, 113. In this embodiment, the first sub-pixels 111 have the smallest area among the other sub-pixels due to the consideration that each of the other sub-pixels is common to the four adjacent pixel units. However, it is noted that the present invention is not limited to any specific area of any of the sub-pixels, and the first, second and third sub-pixels 111, 112, 113 may have the same area or not, and their areas may be adjusted according to the coloring requirements of practical applications.

With continued reference to FIG. 3, in this embodiment, every first sub-pixel 111 is spaced apart from each adjacent first sub-pixel 111 by a distance D1, from each adjacent second sub-pixel 112 by a distance D2 and from each adjacent third sub-pixel 113 by a distance D3. Every two adjacent second sub-pixels 112 are spaced apart from each other by a distance D4, and every two adjacent third sub-pixels 113 are spaced apart from each other by a distance D5. As every second sub-pixel 112 and the adjacent third sub-pixels 113 are common to the four adjacent pixel units, the total area of the second and third sub-pixels 113 is reduced, allowing greater pixel-to-pixel spacings such as, for example, D2, D3, D4 and D5, at the same PPI and aperture ratio as the traditional arrangements. This can result in improved reliability of organic emission layer deposition processes utilizing fine metal masks and reduced process difficulty. In this embodiment, the display panel may be strengthened through placing spacers between the adjacent second sub-pixels 112 and between the adjacent third sub-pixels 113 with greater distances D4 and D5 respectively.

In this embodiment, in each odd-numbered row, second and third sub-pixels 112, 113 are alternately arranged, for example, along the first imaginary line X1 in FIG. 3, with first sub-pixels 111 interposed therebetween, and each even-numbered row contains only several first sub-pixels 111 which are arranged, for example, along the second imaginary line X2 in FIG. 3. In addition, in each odd-numbered column, second and third sub-pixels 112, 113 are alternately arranged, for example, along the first imaginary line Y1 in FIG. 3, with first sub-pixels 111 interposed therebetween, and each even-numbered column contains only several first sub-pixels 111 which are arranged, for example, along the second imaginary line Y2 in FIG. 3. As such, every two adjacent second sub-pixels 112, as well as every two adjacent third sub-pixels 113, are not interposed with a first sub-pixel 111. In other embodiments of the present invention, the second and third sub-pixels 112, 113 may be transposed. In other words, in this case, each odd-numbered row contains only linearly aligned first sub-pixels 111, and each even-numbered row contains second and third sub-pixels 112, 113 that are alternately arranged with first sub-pixels 111 interposed therebetween. Additionally, each odd-numbered column contains only linearly aligned first sub-pixels 111, and each even-numbered column contains second and third sub-pixels 112, 113 that are alternately arranged with first sub-pixels 111 interposed therebetween. It is to be appreciated that FIG. 3 shows only part of the pixel structure in the OLED display panel for the sake of brevity, and the pixel structure may actually include more columns and/or more rows.

In this embodiment, each first sub-pixel 111 is adapted to emit red light and, to this end, includes an organic emission layer for emitting red light; each second sub-pixel 112 is adapted to emit blue light and, to this end, includes an organic emission layer for emitting blue light; each third sub-pixel 113 is adapted to emit green light and, to this end, includes an organic emission layer for emitting green light. It is to be appreciated that these light-emitting functions can be interchanged among the sub-pixels, provided that the first, second and third sub-pixels 111, 112, 113 include at least sub-pixels for emitting red, green and blue light. For example, in other embodiments, the first, second and third sub-pixels 111, 112, 113 may alternatively emit blue, red and green light, respectively. Similar embodiments are also possible and will not be described in detail herein for the sake of brevity.

Embodiment 2

Figure 5:
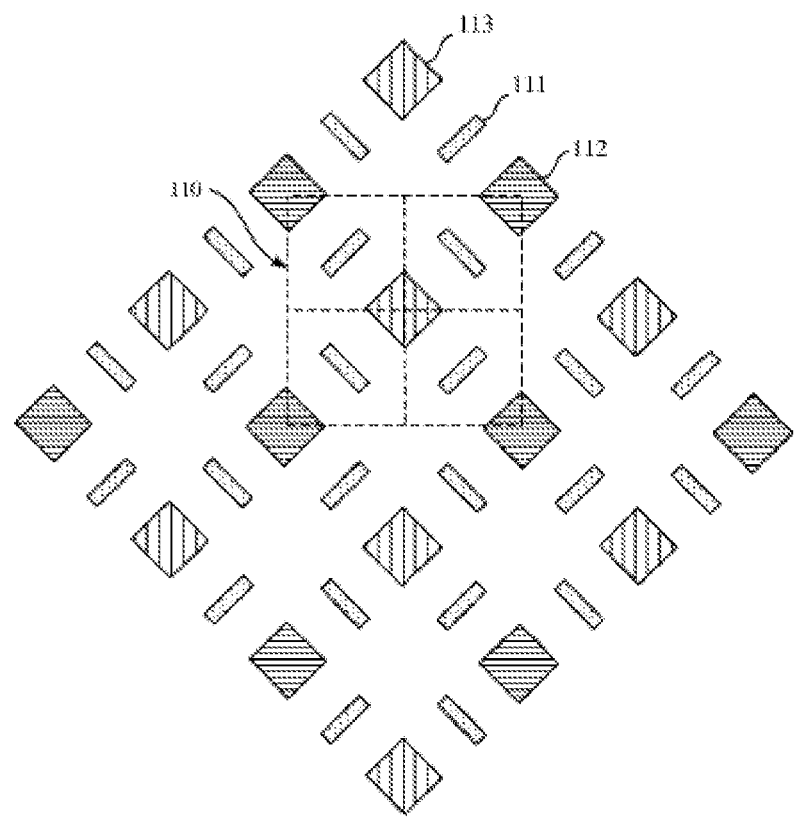
FIG. 5 is a schematic showing part of a pixel structure in an OLED display panel according to a second embodiment of the present invention.
Figure 6:
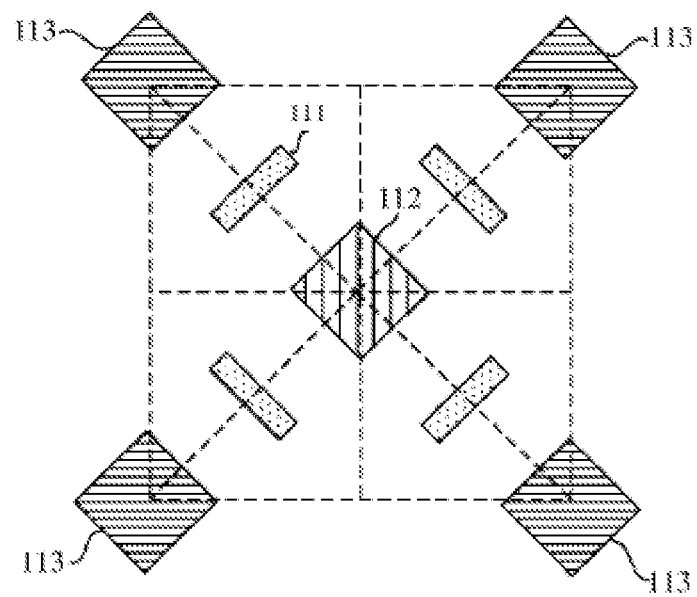
FIG. 6 is a schematic illustration of four pixel units in the pixel structure of FIG. 5.

FIG. 5 is a schematic showing part of a pixel structure in an OLED display panel according to a second embodiment of the present invention. FIG. 6 is a schematic illustration of four pixel units in the pixel structure of FIG. 5.

As shown in FIGS. 5 to 6, the pixel structure of the OLED display panel includes a plurality of pixel units 110 arranged in an array, each comprising three sub-pixels including a first sub-pixel 111, a second sub-pixel 112 and a third sub-pixel 113. The first sub-pixel 111 is dedicated to the specific pixel unit 110, while the second and third sub-pixels 112, 113 are common to four adjacent pixel units.

This embodiment differs from Embodiment 1 only in that the short sides of the first sub-pixel 111 are parallel to a line segment connecting centers of the second and third sub-pixels 112, 113, with its long sides extending perpendicular to this line segment, as shown in FIGS. 5 and 6.

Embodiment 3

Figure 7:
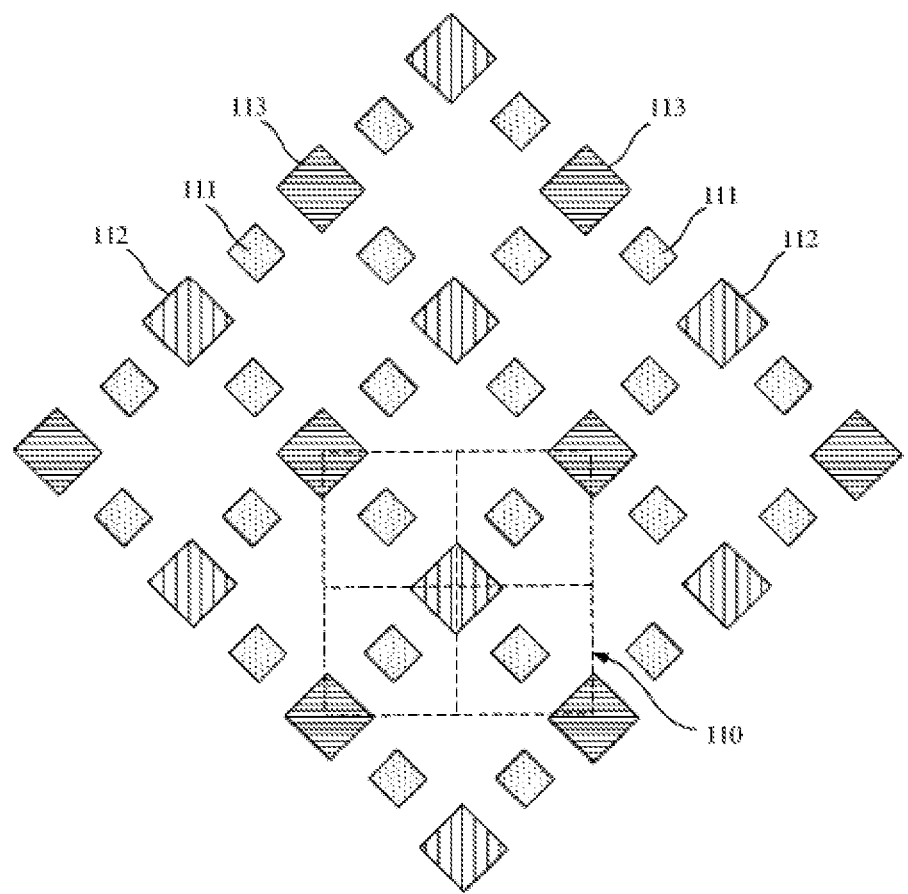
FIG. 7 is a schematic showing part of a pixel structure in an OLED display panel according to a third embodiment of the present invention.
Figure 8:
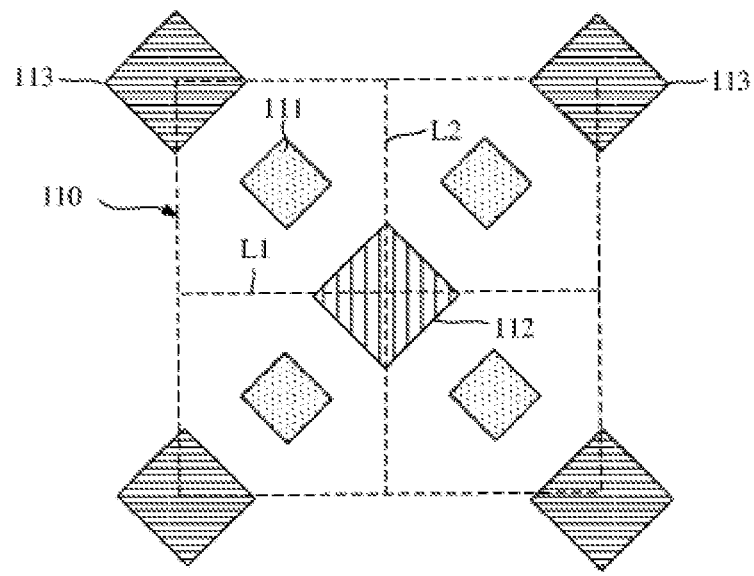
FIG. 8 is a schematic illustration of four pixel units in the pixel structure of FIG. 7.

FIG. 7 is a schematic showing part of a pixel structure in an OLED display panel according to a third embodiment of the present invention. FIG. 8 is a schematic illustration of four pixel units in the pixel structure of FIG. 7.

As shown in FIGS. 7 to 8, the pixel structure includes a plurality of pixel units 110 arranged in an array, each comprising three sub-pixels including a first sub-pixel 111, a second sub-pixel 112 and a third sub-pixel 113. The first sub-pixel 111 is dedicated to the specific pixel unit 110, while the second and third sub-pixels 112, 113 are common to four adjacent pixel units.

This embodiment differs from Embodiment 1 only in that the first, second and third sub-pixels 111, 112, 113 are all squares so that the first, second and third sub-pixels 111, 112, 113 in one pixel unit is in exact symmetry to those in any adjacent pixel unit. Specifically, the first sub-pixels 111 in every two adjacent pixel units are in exact symmetry with respect to a line segment connecting the two second or third sub-pixels 112, 113 both nearest to both of the specific first sub-pixels, for example, the imaginary side L1 or L2 in FIG. 8.

Embodiment 4

An OLED display panel according to this embodiment incorporates the pixel structure according to Embodiment 1, 2 or 3.

In one embodiment, the first, second and third 111, 112, 113 are provided with power lines for driving individual pixels, for example, gate lines, data lines, driving power lines, etc. In addition, they are also provided with insulating layers for limiting the individual sub-pixels, for example, pixel limiting layers. Further, in one embodiment, OLEDs for the individual first, second and third sub-pixels 111, 112, 113 are included, each including an anode, an organic emission layer and a cathode. The shapes of the individual pixels are defined by the corresponding power lines, pixel limiting layers and anodes. This is well-known to those skilled in this art and will not be described in greater detail for the sake of brevity.

The organic emission layers in the individual pixels of the OLED display panel may be fabricated by deposition (e.g., vapor deposition) processes in which masks (e.g., fine metal masks (FMMs)) are utilized. Reducing the spacings between adjacent pixels can lead to an increase in the aperture ratio of the pixels but a reduction in the reliability of the deposition processes. On the other hand, while greater pixel-to-pixel spacings can enhance the reliability of the deposition processes, they can lead to a lower aperture ratio of the pixels. Different from the traditional RGB pixel arrangements, the present invention allows smaller areas of the sub-pixels. This can enable, on the one hand, a higher aperture ratio of the sub-pixels and hence a longer service life of the OLED display panel at the same PPI and design margin, and on the other hand, an increased design margin and reduced process difficulty at the same PPI and aperture ratio because the size-reduced sub-pixels allow greater pixel-to-pixel spacings which are favorable to the reliability of organic emission layer deposition processes utilizing fine metal masks. Furthermore, spacers may be disposed between every two adjacent second sub-pixels, as well as between every two adjacent third sub-pixels, which are more distant from each other, to impart higher strength to the display panel device.

It is noted that the embodiments disclosed herein are described in a progressive manner, with the description of each embodiment focusing on its differences from other embodiments. Reference can be made between the embodiments for their identical or similar parts.

The foregoing description presents merely a few preferred embodiments of the present invention and does not limit the scope thereof in any sense. All changes or modifications made in light of the above disclosure by any person of ordinary skill in the art fall within the scope of protection set forth in the appended claims.

What is claimed is:

1. A pixel structure, comprising a plurality of pixel units arranged in an array, each pixel unit comprising a first sub-pixel, a second sub-pixel and a third sub-pixel, each of the second and third sub-pixels being an integral structure, the second and third sub-pixels being common to four adjacent ones of the pixel units, wherein adjacent four third sub-pixels are arranged to define a quadrilateral encompassing one second sub-pixel and adjacent four first sub-pixels so that four pixel units are formed, wherein each of the four pixel units comprises one of the four third sub-pixels, one of the four first sub-pixels and the one second sub-pixel shared in the four pixel units, each of the four first sub-pixels located between a corresponding one of the four third sub-pixels and the one second sub-pixel shared in the four pixel units, wherein each first sub-pixel is disposed on a line segment connecting centers of the third sub-pixel and the second sub-pixel positioned in a center of the quadrilateral, and wherein the first sub-pixel is a rectangle, each of the second and third sub-pixels is a square, two opposite short sides of each first sub-pixel are respectively substantially aligned with corresponding sides of its adjacent second and third sub-pixels.

2. The pixel structure of claim 1, wherein short sides of each first sub-pixel are parallel to the line segment connecting centers of its adjacent second and third sub-pixels.

3. The pixel structure of claim 1, wherein the first, second and third sub-pixels in one pixel unit are symmetric to corresponding ones in an adjacent pixel unit.

4. The pixel structure of claim 1, wherein short sides of each first sub-pixel are perpendicular to the line segment connecting centers of its adjacent second and third sub-pixels.

5. The pixel structure of claim 1, wherein the first sub-pixel has an area smaller than both an area of the second sub-pixel and an area of the third sub-pixel.

6. An OLED display panel, comprising a pixel structure, the pixel structure comprising a plurality of pixel units arranged in an array, each pixel unit comprising a first sub-pixel, a second sub-pixel and a third sub-pixel, each of the second and third sub-pixels being an integral structure, the second and third sub-pixels being common to four adjacent ones of the pixel units, wherein adjacent four third sub-pixels are arranged to define a quadrilateral encompassing one second sub-pixel and adjacent four first sub-pixels so that four pixel units are formed, wherein each of the four pixel units comprises one of the four third sub-pixels, one of the four first sub-pixels and the one second sub-pixel shared in the four pixel units, each of the four first sub-pixels located between a corresponding one of the four third sub-pixels and the one second sub-pixel shared in the four pixel units, wherein each first sub-pixel is disposed on a line segment connecting centers of the third sub-pixel and the second sub-pixel positioned in a center of the quadrilateral, and wherein the first sub-pixel is a rectangle, each of the second and third sub-pixels is a square, two opposite short sides of each first sub-pixel are respectively substantially aligned with corresponding sides of its adjacent second and third sub-pixels.

* * * * *